United States Patent
Kim

(12) 
(10) Patent No.: US 6,204,070 B1
(45) Date of Patent: Mar. 20, 2001

(54) METHOD FOR MANUFACTURING FERROELECTRIC CAPACITOR

(75) Inventor: Young Bog Kim, Kyoungki-Do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/221,622

(22) Filed: Dec. 28, 1998

(30) Foreign Application Priority Data

Dec. 27, 1997 (KR) ................................................ 97-75076

(51) Int. Cl.[7] ................................................ H01L 21/00
(52) U.S. Cl. ................................................ 438/3; 438/238
(58) Field of Search .................... 438/238, 239, 438/241, 240, 3

(56) References Cited

U.S. PATENT DOCUMENTS

| | | |
|---|---|---|
| 5,046,043 | 9/1991 | Miller et al. .......................... 365/145 |
| 5,407,855 | 4/1995 | Maniar et al. ......................... 437/60 |
| 5,504,041 | 4/1996 | Summerfelt .......................... 437/235 |
| 5,510,651 | 4/1996 | Maniar et al. ........................ 257/751 |
| 5,536,672 | 7/1996 | Miller et al. .......................... 437/52 |
| 5,585,300 | 12/1996 | Summerfelt .......................... 437/60 |
| 5,679,980 | 10/1997 | Summerfelt .......................... 257/751 |
| 5,729,054 | 3/1998 | Summerfelt et al. ................ 257/751 |
| 5,965,942 | * 10/1999 | Itoh et al. ............................. 257/761 |
| 6,043,529 | * 3/2000 | Hartner et al. ....................... 257/306 |

FOREIGN PATENT DOCUMENTS

| | | | |
|---|---|---|---|
| 02198797 | 7/1990 | (JP) | ............................ H01L/27/112 |
| 05316209 | 12/1993 | (JP) | ............................ H01L/21/8242 |
| 08133030 | 5/1996 | (JP) | ............................ H01L/27/108 |
| 08243745 | 9/1996 | (JP) | ............................ H01L/27/108 |
| 09016103 | 1/1997 | (JP) | ............................ H01L/21/60 |

* cited by examiner

Primary Examiner—Richard Elms
Assistant Examiner—Bradley Smith
(74) Attorney, Agent, or Firm—Blakely Sokoloff Taylor & Zafman

(57) ABSTRACT

The present invention relates to a method for manufacturing ferroelectric capacitor, capable of preventing the hydrogen gas generated in the process for the overlying interlayer insulating layer from being diffused into the underlying ferroelectric material film and/or the first diffusion barrier $TiO_2$ film, thereby eliminating the aggravation of the characteristics of the ferroelectric capacitor. As ferroelectric material film, $SrBi_{2-x}Ta_2O_{9-x}$ (simply SBT) film or PZT film can be formed. For PZT film, $TiO_2$ is used for a first diffusion barrier film, silicon nitride such as $Si_3N_4$ or SiON is used for a second diffusion barrier film, and $SiO_2$ film can be provided under the silicon nitride film as a stress buffer film. Alternatively, for the SBT, a silicon nitride film is provided as a diffusion barrier film and a $SiO_2$ film is further provided under the silicon nitride film as a stress buffer film. Such a silicon nitride film prevents hydrogen or oxygen generated in the following process from being introduced into the underlying ferroelectric material film. Thus, the ferroelectric material can be remain stable in stochiometry in relatively long time, thereby improve the reliability thereof.

22 Claims, 2 Drawing Sheets

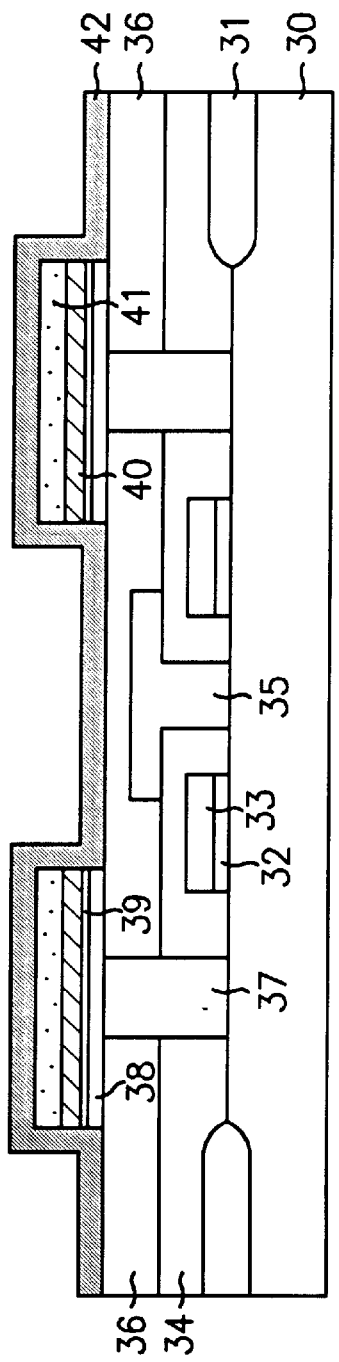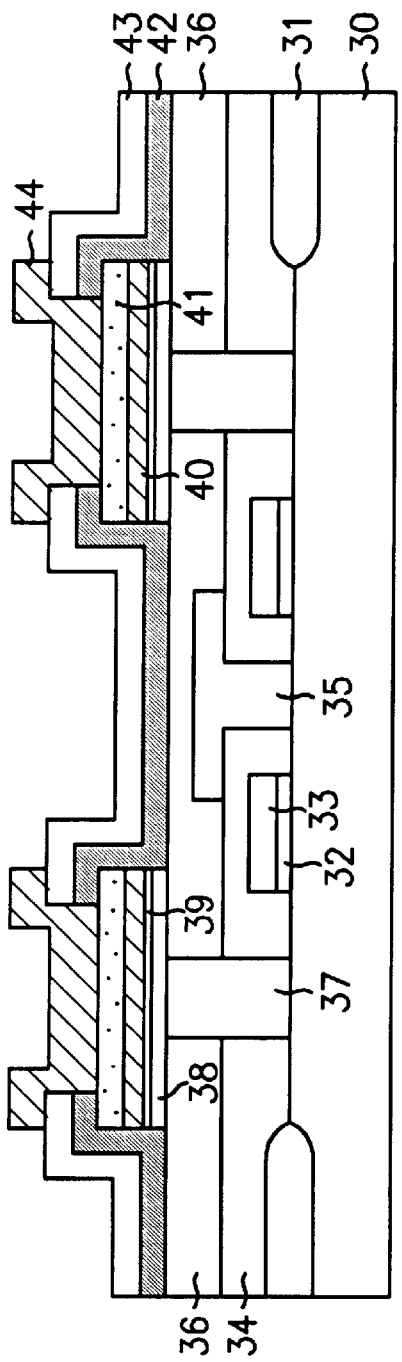

METHOD FOR MANUFACTURING FERROELECTRIC CAPACITOR

FIELD OF THE INVENTION

The present invention relates to a method for manufacturing a semiconductor device, more particularly to a method for manufacturing a ferroelectric capacitor.

DESCRIPTION OF THE PRIOR ART

The ferroelectric material has a large permittivity at room temperature and has multiple polarization states. One of the multiple polarization states can be selected depending on the applied electric field to the ferroelectric material. When a particular polarization state is set in a ferroelectric material, it is retained even when no power is further applied to the material. It is, therefore, possible to store a particular state in a non-powered device and then read the state at later time. In other words, the ferroelectric material can be used for implementation of a non-volatile memory element. Generally, for the ferroelectric material, there are two stable polarization states one of which corresponds to data "0" and the other corresponds to data "1". Also, the ferroelectric material is in general formed as thin film between a top and a bottom electrode layers, which corresponds to a ferroelectric capacitor.

In conventional ferroelectric capacitor, there is a problem in that hydrogen or oxygen generated in the subsequent-processes may be introduced into the underlying ferroelectric capacitor material film, thereby making the composition of the ferroelectric material uneven. Thus, the conventional ferroelectric capacitor has such problems as fatigue and/or aging.

SUMMARY OF THE INVENTION

Accordingly, the present invention is addressed to solve the above problems. The object of the present invention is to provide a method for manufacturing ferroelectric capacitor which is capable of preventing hydrogen or oxygen atoms from being diffused into the ferroelectric material film, thereby eliminating the degradation of the characteristics of the ferroelectric capacitor.

According to one aspect of the present invention to achieve the above object, there is provided a method for manufacturing ferroelectric capacitor comprising the steps of: forming a bottom electrode over a semiconductor substrate; forming a ferroelectric material film over the bottom electrode; forming a diffusion barrier film over the ferroelectric material film using silicon nitride; opening a contact hole exposing a part of the ferroelectric material film by patterning the diffusion barrier film; and forming a top electrode coupled to the ferroelectric material film through the contact hole.

In one preferred embodiment, the diffusion barrier film comprises $Si_3N_4$ or $SiO_xN_y$. The method preferably further comprises the step of forming a stress buffer film using silicon dioxide ($SiO_2$), prior to the step of forming the diffusion barrier film using silicon nitride. In this case, the contact hole is made by patterning the diffusion barrier film and the stress buffer film. The silicon dioxide stress buffer film is preferably formed by PECVD. It is also preferable that the ferroelectric material film comprises $SrBi_{2-x}Ta_2O_{9-x}$. The $SrBi_{2-x}Ta_2O_{9-x}$ ferroelectric material film is formed by spin coating method, MOCVD (Metal Organic Chemical Vapor Deposition), or LSMCD (Liquid source mixed chemical deposition) and its thickness is preferably 1000 Å–2500 Å. In addition, the bottom electrode is preferably composed of sequentially deposited Ti/TiN/Pt.

According to another aspect of the present invention, there is provided a method for manufacturing ferroelectric capacitor comprising the steps of: forming a bottom electrode over a semiconductor substrate; forming a ferroelectric material film over the bottom electrode; forming a first diffusion barrier film over the ferroelectric material film using $TiO_2$; forming a second diffusion barrier film over the first diffusion barrier film using silicon nitride; opening a contact hole exposing a part of the ferroelectric material film by patterning the first and second diffusion barrier films; and forming a top electrode coupled to the ferroelectric material film through the contact hole.

In preferred embodiments, the second diffusion barrier film is formed at the temperature between approximately 650° C. and 800° C. using $Si_3N_4$. It is also preferable that the second diffusion barrier film is approximately 50 Å–500 Å in thickness. Alternatively, the second diffusion barrier film comprises $SiO_xN_y$.

The method may further comprise the step of performing a thermal rapid process, after the step of forming the first diffusion barrier film. It is also preferable that the first diffusion barrier film is approximately 400 Å–600 Å in thickness and it is formed by CVD(Chemical Vapor Deposition) or PECVD(Plasma Enhanced Chemical Vapor Deposition). When the first diffusion barrier film is formed by PECVD, the applied power is preferably 80W–200W. Also, the ferroelectric material film is preferably formed using PZT. The method may further comprises the step of forming a stress buffer film between the first diffusion barrier film and the second diffusion barrier film using silicon dioxide ($SiO_2$), and the step of forming the contact hole is made by patterning the second diffusion barrier film, the stress buffer film and the first diffusion barrier film.

According to still another aspect of the present invention, there is provided a method for manufacturing ferroelectric capacitor comprising the steps of: forming a bottom electrode over a semiconductor substrate; forming a ferroelectric material film over the bottom electrode; patterning the ferroelectric material film and the bottom electrode; forming a stress buffer film over the patterned ferroelectric material film using silicon dioxide; forming a diffusion barrier film over the stress buffer film using silicon nitride; forming a contact hole exposing a part of the ferroelectric material film by patterning the diffusion barrier film and the stress buffer film; and forming a top electrode coupled to the ferroelectric material film through the contact hole.

In summary, according to the present invention, a silicon nitride film such as $Si_3N_4$ or SiON film is formed over the ferroelectric material film. Also, as a stress buffer film, silicon dioxide ($SiO_2$) film is formed under the silicon nitride film. In preferred embodiments, a silicon dioxide ($SiO_2$) film and a silicon nitride (e.g. $Si_3N_4$ or SiON) film are sequentially formed over the ferroelectric material film for SBT, whereas a $TiO_2$ film, a silicon dioxide ($SiO_2$) film and a silicon nitride (e.g. $Si_3N_4$ or SiON) film are sequentially formed over the ferroelectric material film for PZT.

BRIEF DESCRIPTION OF DRAWINGS

For a more complete understanding of the present invention and the advantage thereof, reference is now made in the following description taken in conjunction with the accompanying drawings in which:

FIGS. 2a–2c are sectional views for illustrating a method for manufacturing a ferroelectric capacitor according to one preferred embodiment of the present invention.

DETAILED DESCRIPTION OF THE INVENTION

Prior to the detailed description of the preferred embodiment of the present invention, the general ferroelectric capacitor structure of this applicant will be explained with reference to FIG. 1.

Figure 1:
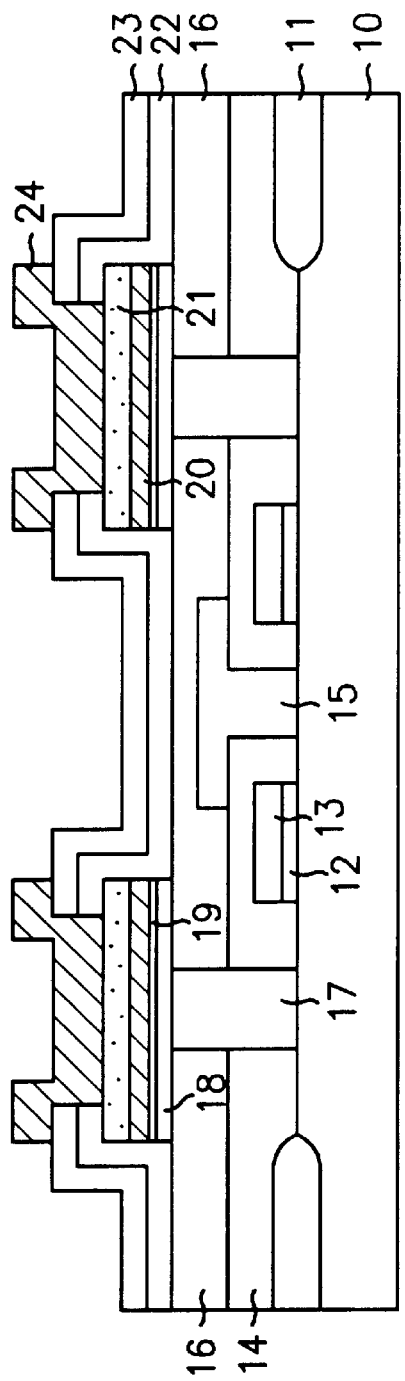
FIG. 1 is a sectional view of a general ferroelectric capacitor structure.

As shown in FIG. 1, interlayer insulating films 14 and 16, which are disposed over semiconductor substrate 10, are selectively etched to form a contact hole. A polysilicon plug 17 is formed, which is coupled through the contact hole to the semiconductor substrate 10. Then, as a barrier metal film, a titanium film 18 and a titanium nitride film 19 are formed. Subsequently, for bottom electrode, a Pt film 20 is formed over the titanium nitride film 19. Also the Pt film 20, the titanium film 19 and the titanium film 18 are selectively etched to form the bottom electrode pattern. Then, over the bottom electrode, a $(Pb, Zr)TiO_3$ film (hereinafter it is simply called as PZT film) 21 is formed and then selectively etched to form a predetermined pattern. Next, $TiO_2$ film 22 and $SiO_2$ film 23 are formed as a diffusion barrier film and an insulating film, respectively, and then selectively etched to expose the PZT film 21. Also, a Platinum film 24 is formed and then selectively etched to form a top electrode coupled to the exposed PZT film 21. Then, an interlayer insulating film is formed and planarized. In FIG. 1, the reference numeral '11' represents a field insulating layer, '12' a gate insulating film, '13' a gate electrode and '15' a bit line, respectively.

In the above ferroelectric capacitor structure, the patterning for the bottom electrode films 18, 19 and 20 and the ferroelectric material film 21 are generally made by RI. Though the plasma used in the PECVD gives a little amount of damage to the ferroelectric material film 21 in the side, such damage does not affect the normal operation of the ferroelectric capacitor. However, if the primarily damaged ferroelectric material film (especially the side thereof) were cumulatively injured in the following process such as the etching process for the top electrode 24, the reliability of the ferroelectric capacitor might be rapidly aggravated. In addition, if the ferroelectric material is $SrBi_2Ta_2O_9$, then Sr, Bi or Ta from the $SrBi_2Ta_2O_9$ film are less likely to couple to oxygen than Ti. Therefore, the activated oxygen from the $SrBi_2Ta_2O_9$ film is likely to be diffused to the $TiO_2$ film, thereby modifying the composition of the ferroelectric material film. That is, it is difficult to maintain the $SrBi_2Ta_2O_9$ film stable in stochiometry.

In addition, since the atom radius of Ti is small, the Ti existing in single atom can be diffused into the ferroelectric material film so as to cause the interstitial defects, thereby deteriorating the electric characteristics. Such problems are aggravated by the fact that the hydrogen introduced from an oxidation film formed over $TiO_2$ film into the $TiO_2$ film can react with the oxygen of the $TiO_2$ film to volatize.

Figure 2A:
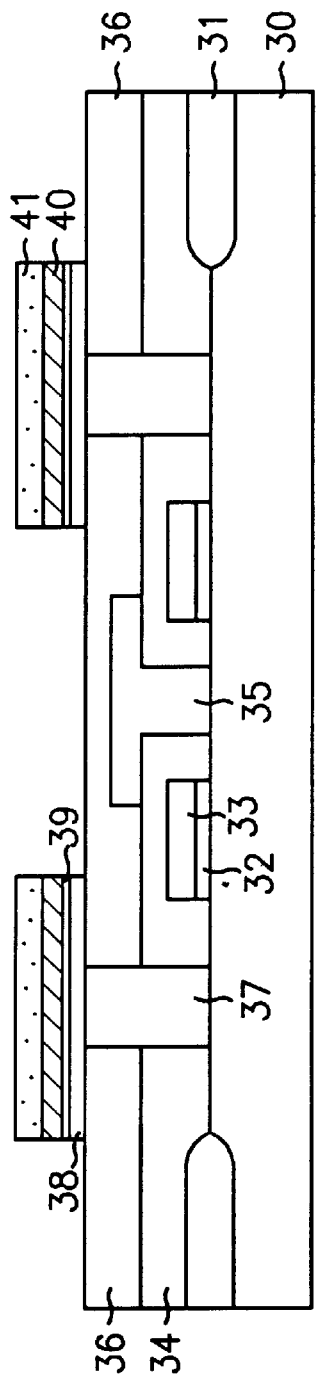

Here, the preferred embodiments of the present invention will be in detail explained, with reference to FIGS. 2a to 2c, which are the sectional views for illustrating the fabrication process of the ferroelectric capacitor.

First, as shown in FIG. 2a, the interlayer insulating fill 34 and 36 formed over the semiconductor substrate 30 are selectively etched to form a contact hole. The polysilicon film is formed and the chemical mechanical polishing is performed, so as to form the polysilicon plug 37 coupled though the semiconductor substrate 30. Here, the semiconductor substrate 30 means in general not only simple semiconductor substrate such as silicon substrate but also complex semiconductor substrate (Here, 'complex' means that it may include some underlying circuit element(s) such as MOS transistor).

Subsequently, as barrier metal films, a titanium (Ti) film 38 and a titanium nitride (TiN) film 39 are formed. Then, in order for forming the bottom electrode, a Pt film 40 is formed over the TiN film 39 and then a PZT film 41 as a ferroelectric material film is formed. The PZT film 41, the Pt film 40, the titanium nitride film 39 and the titanium film 38 are patterned by selectively etching.

Next, as shown in FIG. 2b, $TiO_2$ film 42 is formed as the first diffusion barrier film covering the $SrBi_{2-x}Ta_2O_{9-x}$ film 41 and its thickness is preferably 400 Å–600Å. According to the preferred embodiment, the $TiO_2$ film can be formed by chemical vapor deposition or PECVD (Plasma Enhanced Chemical Vapor Deposition) and the applied power may be controlled to 80W–200W. After forming the $TiO_2$ film 42, thermal rapid process is preferably performed for increasing the crystallization of the $TiO_2$ film 42, thereby reducing the damage the ferroelectric material film 41. Here, the first diffusion barrier film may be formed using $Ta_2O$ or $SrTiO_3$ instead.

Thereafter, as shown in FIG. 2c, a second diffusion barrier film 43 is formed using silicon nitride. The used silicon nitride preferably is $Si_3N_4$ or SiON. The second diffusion barrier film may be formed by LPCVD or PECVD. The deposition of the $Si_3N_4$ diffusion barrier film 43, is preferably performed at approximately 650° C.–800° C. and the thickness is preferably controlled to approximately 50–500 Å. For LPCVD of the film 43, $SiH_4$, $Si_2H_6$ or $SiH_2Cl_2$ along with $NH_3$ are used as the reactant materials for formation of $Si_3N_4$. In this case, the flowing quantity of $NH_3$ is preferably controlled to 700–1000 sccm and the reactants including Si is preferably controlled to 80–200 sccm. This diffusion barrier film 43 prevents the $SrBi_{2-x}Ta_2O_{9-x}$ film 41 from being damaged in the process for an interlayer insulating layer which may be formed over the ferroelectric capacitor and include much oxygen and hydrogen. Though silicon nitride such as $Si_3N_4$ is good barrier material, it is likely to undergo stress. So it is preferable that, as shown in FIG. 2c, $TiO_2$ film 42 is formed under the silicon nitride film 43. More preferably, in order to reduce the stress of the silicon nitride film 43, $SiO_2$ film is formed between the $TiO_2$ film 42 and the silicon nitride film 43 as a stress buffer film. This silicon dioxide ($SiO_2$) film can be preferably formed by deposition such as PECVD.

Subsequently, the second diffusion barrier $Si_3N_4$ or SiON film 43 and the first diffusion barrier $TiO_2$ film 42 are selectively etched to form a contact hole exposing the part of the ferroelectric material film 41. The Pt film 44 is deposited on the contact hole and then patterned to form the top electrode of the ferroelectric capacitor, in which the top electrode is coupled to the exposed ferroelectric material film 41. Here, the top electrode 44 may be formed other conductive material such as metal. In FIGS. 2a and 2b, the reference numeral '31' represents the field oxide layer, '32' the gate oxide film, '33' the gate electrode and '35' the bit line.

According to another preferred embodiment, the ferroelectric material film 41 in FIGS. 2a–2c can be formed using $SrBi_{2-x}Ta_2O_{9-x}$ (simply SBT or SBT (Y1) ). The $SrBi_{2-x}Ta_2O_{9-x}$ film 41 can be formed by spin coating, MOCVD (Metal Organic Chemical Vapor Deposition), LSMCD (Liquid Source Mixed Chemical Deposition) or sputtering method. Also, the thickness of $SrBi_{2-x}Ta_2O_{9-x}$ film 41 is preferably 1000 Å–2500 Å. The $SrBi_{2-x}Ta_2O_{9-x}$ film 41 is preferably $SrBi Ta_2O_9$.

When the ferroelectric material film 41 is SBT, the first diffusion barrier film or $TiO_2$ film 42 is preferably omitted. Also, under the silicon nitride film 43, a silicon dioxide ($SiO_2$) film is preferably formed as a stress buffer film.

Although the preferred embodiments of the present invention have been illustrated with reference to the accompanying drawings, it will be understood that the invention is not limited to the embodiments disclosed, but is capable of numerous rearrangements, modifications and substitutions without departing from the scope of the invention.

According to the present invention as described above, the generated hydrogen or oxygen in the subsequently-performed process can be prevented from being diffused into the underlying ferroelectric material film by the diffusion barrier silicon nitride (e.g. $Si_3N_4$ or SiON) film. Thus, since the ferroelectric material film can be protected from the plasma in the following high-temperature or etching (e.g. etching for top electrode) processes, the composition of the ferroelectric material film can be remain stable in stochiometry. Therefore, the reliability of the ferroelectric capacitor is increased, the fatigue and/or the aging problems are substantially eliminated and the polarization of the ferroelectric material film can be remain stable in relatively long time, so as to improve the characteristics of the ferroelectric capacitor.

What is claimed is:

1. A method for manufacturing a ferroelectric capacitor comprising the steps of:
    forming a bottom electrode over a semiconductor substrate;
    forming a ferroelectric material film over the bottom electrode;
    forming a diffusion barrier film over the bottom electrode;
    forming a diffusion barrier film over the ferroelectric material film using silicon nitride;
    forming a contact hole to expose a part of the ferroelectric material film by removing a portion of the diffusion barrier film;
    forming a top electrode to couple the ferroelectric material film to the bottom electrode through the contact hole.

2. The method for manufacturing ferroelectric capacitor according to claim 1,
    wherein said diffusion barrier film comprises $Si_3N_4$.

3. The method for manufacturing ferroelectric capacitor according to claim 1,
    wherein said diffusion barrier film comprises $SiO_xN_y$.

4. The method for manufacturing ferroelectric capacitor according to claim 1, further comprising the step of:
    forming a stress buffer film using silicon dioxide($SiO_2$), prior to the step of forming the diffusion barrier film using silicon nitride; and
    wherein said step of forming the contact hole is made by patterning said diffusion barrier film and said stress buffer film.

5. The method for manufacturing ferroelectric capacitor according to claim 4,
    wherein said silicon dioxide stress buffer film is formed by PECVD.

6. The method for manufacturing a ferroelectric capacitor according to claim 1,
    wherein said ferroelectric material film comprises strontium bismuth tantalate (SBT).

7. The method for manufacturing ferroelectric capacitor according to claim 6,
    Wherein said ferroelectric material film is formed by spin coating method, MOCVD (Metal Organic Chemical Vapor Deposition), or LSMCD (Liquid source mixed chemical deposition).

8. The method for manufacturing ferroelectric capacitor according to claim 7,
    wherein said ferroelectric material film is 1000 Å–2500 Å in thickness.

9. The method for manufacturing ferroelectric capacitor according to claim 1,
    wherein said bottom electrode is composed of sequentially deposited Ti/TiN/Pt.

10. A method for manufacturing a ferroelectric capacitor comprising the steps of:
    forming a bottom electrode over a semiconductor substrate;
    forming a ferroelectric material film over the bottom electrode;
    forming a first diffusion barrier film over the ferroelectric material film using $TiO_2$;
    forming a second diffusion barrier film over said first diffusion barrier film using silicon nitride;
    forming a contact hole to expose a part of the ferroelectric material film by removing portions of the first and the second diffusion barrier films; and
    forming a top electrode to couple the ferroelectric material film to the bottom electrode through the contact hole.

11. The method for manufacturing ferroelectric capacitor according to claim 10,
    wherein said second diffusion barrier film comprises $Si_3N_4$.

12. The method for manufacturing ferroelectric capacitor according to claim 11,
    wherein said second diffusion barrier film is formed at the temperature between approximately 650° C. and 800° C.

13. The method for manufacturing ferroelectric capacitor according to claim 11,
    wherein said second diffusion barrier film is approximately 50 Å–500 Å in thickness.

14. The method for manufacturing ferroelectric capacitor according to claim 10,
    wherein said diffusion barrier film comprises $SiO_xN_y$.

15. The method for manufacturing ferroelectric capacitor according to claim 10, further comprising the step of:
    performing a thermal rapid process, after the step of forming the first diffusion barrier film.

16. The method for manufacturing ferroelectric capacitor according to claim 10,
    wherein said first diffusion barrier film is 400 Å–600 Å in thickness.

17. The method for manufacturing ferroelectric capacitor according to claim 16,
    wherein said first diffusion barrier film is formed by CVD(Chemical Vapor Deposition) or PECVD(Plasma Enhanced Chemical Vapor Deposition).

18. The method for manufacturing ferroelectric capacitor according to claim 17,
    wherein said first diffusion barrier film is formed by PECVD applying 80W–200W in power.

19. The method for manufacturing ferroelectric capacitor according to the claim 10,
   wherein said ferroelectric material film is formed using PZT.

20. The method for manufacturing ferroelectric capacitor according to claim 10, further comprising the step of:
   forming a stress buffer film between said first diffusion barrier film and said second diffusion barrier film using silicon dioxide ($SiO_2$); and
   wherein the step of forming the contact hole is made by patterning said second diffusion barrier film, said stress buffer film and said first diffusion barrier film.

21. The method for manufacturing ferroelectric capacitor according to claim 10,
   wherein said bottom electrode is composed of sequentially deposited Ti/TiN/Pt.

22. A method for manufacturing ferroelectric capacitor comprising the steps of:
   forming a bottom electrode over a semiconductor substrate;
   forming a ferroelectric material film over the bottom electrode;
   patterning said ferroelectric material film and said bottom electrode;
   forming a stress buffer film over the patterned ferroelectric material film using silicon dioxide;
   forming a diffusion barrier film over the stress buffer film using silicon nitride;
   forming a contact hole exposing a part of the ferroelectric material film by patterning said diffusion barrier film and said stress buffer film; and
   forming a top electrode coupled to the ferroelectric material film through the contact hole.

* * * * *

UNITED STATES PATENT AND TRADEMARK OFFICE
CERTIFICATE OF CORRECTION

PATENT NO. : 6,204,070 B1  Page 1 of 1
DATED : March 20, 2001
INVENTOR(S) : Kim

It is certified that error appears in the above-identified patent and that said Letters Patent is hereby corrected as shown below:

Column 5, claim 1,
Line 43, after "barrier film;" insert -- and --.
Line 44, after "couple" insert -- to --.

Column 7, claim 19,
Line 2, delete "the".

Signed and Sealed this

Twenty-sixth Day of February, 2002

Attest:

Attesting Officer

JAMES E. ROGAN
*Director of the United States Patent and Trademark Office*